US010345721B1

(12) United States Patent
Cao et al.

(10) Patent No.: US 10,345,721 B1
(45) Date of Patent: Jul. 9, 2019

(54) MEASUREMENT LIBRARY OPTIMIZATION IN SEMICONDUCTOR METROLOGY

(71) Applicant: KLA-Tencor Corporation, Milpitas, CA (US)

(72) Inventors: Meng Cao, Union City, CA (US); Lie-Quan Lee, Fremont, CA (US); Qiang Zhao, Milpitas, CA (US); Heyin Li, Shanghai (CN); Mengmeng Ye, Shanghai (CN)

(73) Assignee: KLA-Tencor Corporation, Milpitas, CA (US)

( * ) Notice: Subject to any disclaimer, the term of this patent is extended or adjusted under 35 U.S.C. 154(b) by 44 days.

(21) Appl. No.: 15/184,782

(22) Filed: Jun. 16, 2016

Related U.S. Application Data (60) Provisional application No. 62/180,517, filed on Jun. 16, 2015.

(51) Int. Cl.
*G03F 9/00* (2006.01)

(52) U.S. Cl.
CPC ..................... *G03F 9/70* (2013.01)

(58) Field of Classification Search
CPC .......................................................... G03F 9/70
USPC ....................................................... 356/369
See application file for complete search history.

(56) References Cited

U.S. PATENT DOCUMENTS

| | | | |
|---|---|---|---|
| 5,608,526 A | 3/1997 | Piwonka-Corle et al. | |
| 5,859,424 A | 1/1999 | Norton et al. | |
| 6,429,943 B1 | 8/2002 | Opsal et al. | |
| 7,478,019 B2 | 1/2009 | Zangooie et al. | |
| 7,933,026 B2 | 4/2011 | Opsal et al. | |
| 8,040,511 B1* | 10/2011 | Krishnan | G01N 21/211 356/369 |
| 2006/0146347 A1* | 7/2006 | Smith | G01B 11/24 356/625 |
| 2006/0167651 A1* | 7/2006 | Zangooie | G01B 11/0625 702/179 |
| 2009/0063077 A1* | 3/2009 | Liu | G05B 19/41875 702/82 |
| 2009/0225317 A1* | 9/2009 | Tanaka | G01J 4/00 356/369 |

(Continued)

*Primary Examiner* — Tarifur R Chowdhury
*Assistant Examiner* — Omar Nixon
(74) *Attorney, Agent, or Firm* — Spano Law Group; Joseph S. Spano (57) ABSTRACT

Methods and systems for optimizing a set of measurement library control parameters for a particular metrology application are presented herein. Measurement signals are collected from one or more metrology targets by a target measurement system. Values of user selected parameters of interest are resolved by fitting a pre-computed measurement library function to the measurement signals for a given set of library control parameters. Values of one or more library control parameters are optimized such that differences between the values of the parameters of interest estimated by the library based measurement and reference values associated with trusted measurements of the parameters of interest are minimized. The optimization of the library control parameter values is performed without recalculating the pre-computed measurement library. Subsequent library based measurements are performed by the target measurement system using the optimized set of measurement library control parameters with improved measurement performance.

16 Claims, 8 Drawing Sheets

(56) References Cited

U.S. PATENT DOCUMENTS

| | | | |
|---|---|---|---|
| 2011/0205518 A1* | 8/2011 | Van De Kerkhof | ........................ G03F 7/70633 355/67 |
| 2012/0206729 A1* | 8/2012 | Seligson | ............. G03F 7/70633 356/445 |
| 2013/0305206 A1* | 11/2013 | Pandev | ............... G06F 17/5081 716/136 |
| 2014/0111791 A1 | 4/2014 | Manassen et al. | |
| 2014/0172394 A1 | 6/2014 | Kuznetsov et al. | |
| 2014/0199791 A1* | 7/2014 | Park | ........................ H01L 22/12 438/14 |
| 2014/0222380 A1 | 8/2014 | Kuznetsov et al. | |
| 2014/0316730 A1* | 10/2014 | Shchegrov | .............. H01L 22/12 702/81 |
| 2014/0347666 A1* | 11/2014 | Veldman | .............. G01N 21/211 356/369 |
| 2014/0358485 A1* | 12/2014 | Lee | .................... G03F 7/70625 702/189 |
| 2014/0379281 A1* | 12/2014 | Pandev | ............... G06F 17/5081 702/40 |
| 2015/0219446 A1* | 8/2015 | Leem | .................... G01B 11/24 356/369 |
| 2015/0323316 A1* | 11/2015 | Shchegrov | ......... G01N 21/9501 702/150 |

\* cited by examiner

| | WEIGHTING | | | | OFFSET-A | | OFFSET-B | |
|---|---|---|---|---|---|---|---|---|
| ITER | RPSE0 | RPSE90 | LDSR0 | LDSR90 | $R_{SQ}$ | SLOPE | $R_{SQ}$ | SLOPE |
| 0 | 1 | 1 | 1 | 1 | 0.988 | 1.022 | 0.565 | 1.147 |
| 1 | 1 | 6.74 | 7.49 | 0.01 | 0.993 | 1.028 | 0.760 | 1.028 |
| 2 | 1 | 13.75 | 26.76 | 0.01 | 0.994 | 1.014 | 0.826 | 0.957 |
| 3 | 1 | 8.53 | 43.21 | 0.01 | 0.997 | 1.013 | 0.896 | 1.011 |
| 4 | 1 | 13.71 | 44.50 | 0.01 | 0.996 | 1.011 | 0.871 | 0.968 |
| 5 | 1 | 10.50 | 45.48 | 0.01 | 0.997 | 1.012 | 0.891 | 0.994 |
| 6 | 1 | 11.26 | 45.82 | 0.01 | 0.997 | 1.011 | 0.888 | 0.987 |
| 7 | 1 | 11.39 | 46.31 | 0.01 | 0.997 | 1.011 | 0.888 | 0.987 |
| 8 | 1 | 11.34 | 46.64 | 0.01 | 0.997 | 1.011 | 0.889 | 0.987 |
| 9 | 1 | 11.31 | 46.87 | 0.01 | 0.997 | 1.011 | 0.889 | 0.987 |

| | WEIGHTING | | | | OFFSET-C | | OFFSET-D | |
|---|---|---|---|---|---|---|---|---|
| ITER | RPSE0 | RPSE90 | LDSR0 | LDSR90 | $R_{SQ}$ | SLOPE | $R_{SQ}$ | SLOPE |
| 0 | 1 | 1 | 1 | 1 | 0.051 | 0.787 | 0.159 | 1.131 |
| 1 | 1 | 6.74 | 7.49 | 0.01 | 0.404 | 1.074 | 0.555 | 1.018 |
| 2 | 1 | 13.75 | 26.76 | 0.01 | 0.661 | 1.135 | 0.714 | 0.914 |
| 3 | 1 | 8.53 | 43.21 | 0.01 | 0.724 | 0.949 | 0.719 | 0.839 |
| 4 | 1 | 13.71 | 44.50 | 0.01 | 0.722 | 1.067 | 0.740 | 0.860 |
| 5 | 1 | 10.50 | 45.48 | 0.01 | 0.740 | 0.995 | 0.738 | 0.843 |
| 6 | 1 | 11.26 | 45.82 | 0.01 | 0.739 | 1.012 | 0.741 | 0.846 |
| 7 | 1 | 11.39 | 46.31 | 0.01 | 0.740 | 1.014 | 0.742 | 0.846 |
| 8 | 1 | 11.34 | 46.64 | 0.01 | 0.741 | 1.012 | 0.742 | 0.845 |
| 9 | 1 | 11.31 | 46.87 | 0.01 | 0.741 | 1.011 | 0.742 | 0.845 |

| | WEIGHTING | | | | OFFSET-E | | AVERAGE $CHI^2$ |
|---|---|---|---|---|---|---|---|
| ITER | RPSE0 | RPSE90 | LDSR0 | LDSR90 | $R_{SQ}$ | SLOPE | |
| 0 | 1 | 1 | 1 | 1 | 0.869 | 1.026 | 137.3 |
| 1 | 1 | 6.74 | 7.49 | 0.01 | 0.943 | 0.959 | 56.7 |
| 2 | 1 | 13.75 | 26.76 | 0.01 | 0.959 | 0.955 | 34.5 |
| 3 | 1 | 8.53 | 43.21 | 0.01 | 0.965 | 0.968 | 27.8 |
| 4 | 1 | 13.71 | 44.50 | 0.01 | 0.964 | 0.960 | 28.2 |
| 5 | 1 | 10.50 | 45.48 | 0.01 | 0.965 | 0.965 | 27.5 |
| 6 | 1 | 11.26 | 45.82 | 0.01 | 0.965 | 0.964 | 27.5 |
| 7 | 1 | 11.39 | 46.31 | 0.01 | 0.965 | 0.964 | 27.4 |
| 8 | 1 | 11.34 | 46.64 | 0.01 | 0.965 | 0.964 | 27.3 |
| 9 | 1 | 11.31 | 46.87 | 0.01 | 0.965 | 0.964 | 27.2 |

| | WEIGHTING | | | OFFSET-A | | OFFSET-B | |
|---|---|---|---|---|---|---|---|
| ITER | LDSR0 | LDSR90 | RPRC45 | $R_{SQ}$ | SLOPE | $R_{SQ}$ | SLOPE |
| 0 | 1 | 1 | 1 | 0.943 | 0.986 | 0.557 | 0.852 |
| 1 | 1 | 1.10 | 0.88 | 0.946 | 0.987 | 0.579 | 0.863 |
| 2 | 1 | 1.41 | 0.45 | 0.965 | 0.991 | 0.717 | 0.941 |
| 3 | 1 | 1.48 | 0.19 | 0.985 | 0.994 | 0.778 | 1.073 |
| 4 | 1 | 1.30 | 0.18 | 0.984 | 0.993 | 0.788 | 1.060 |
| 5 | 1 | 1.04 | 0.10 | 0.988 | 0.991 | 0.773 | 1.105 |
| 6 | 1 | 0.50 | 0.08 | 0.979 | 0.984 | 0.820 | 1.018 |
| 7 | 1 | 0.15 | 0.01 | 0.988 | 0.969 | 0.879 | 1.017 |
| 8 | 1 | 0.15 | 0.01 | 0.988 | 0.969 | 0.879 | 1.017 |
| 9 | 1 | 0.15 | 0.01 | 0.988 | 0.969 | 0.879 | 1.017 |
| 10 | 1 | 0.15 | 0.002 | 0.992 | 0.964 | 0.881 | 1.056 |

| | WEIGHTING | | | OFFSET-C | | OFFSET-D | |
|---|---|---|---|---|---|---|---|
| ITER | LDSR0 | LDSR90 | RPRC45 | $R_{SQ}$ | SLOPE | $R_{SQ}$ | SLOPE |
| 0 | 1 | 1 | 1 | 0.647 | 1.460 | 0.618 | 1.098 |
| 1 | 1 | 1.10 | 0.88 | 0.653 | 1.458 | 0.618 | 1.087 |
| 2 | 1 | 1.41 | 0.45 | 0.691 | 1.418 | 0.624 | 1.014 |
| 3 | 1 | 1.48 | 0.19 | 0.711 | 1.288 | 0.632 | 0.887 |
| 4 | 1 | 1.30 | 0.18 | 0.713 | 1.295 | 0.637 | 0.902 |
| 5 | 1 | 1.04 | 0.10 | 0.693 | 1.216 | 0.642 | 0.855 |
| 6 | 1 | 0.50 | 0.08 | 0.701 | 1.292 | 0.663 | 0.959 |
| 7 | 1 | 0.15 | 0.01 | 0.788 | 1.225 | 0.758 | 0.976 |
| 8 | 1 | 0.15 | 0.01 | 0.788 | 1.225 | 0.758 | 0.976 |
| 9 | 1 | 0.15 | 0.01 | 0.788 | 1.225 | 0.758 | 0.976 |
| 10 | 1 | 0.15 | 0.002 | 0.780 | 1.094 | 0.771 | 0.915 |

| | WEIGHTING | | | OFFSET-E | | AVERAGE CHI$^2$ |
|---|---|---|---|---|---|---|
| ITER | LDSR0 | LDSR90 | RPRC45 | $R_{SQ}$ | SLOPE | |
| 0 | 1 | 1 | 1 | 0.967 | 0.926 | 132.1 |
| 1 | 1 | 1.10 | 0.88 | 0.969 | 0.928 | 130.7 |
| 2 | 1 | 1.41 | 0.45 | 0.980 | 0.938 | 119.9 |
| 3 | 1 | 1.48 | 0.19 | 0.991 | 0.953 | 99.1 |
| 4 | 1 | 1.30 | 0.18 | 0.991 | 0.952 | 98.9 |
| 5 | 1 | 1.04 | 0.10 | 0.993 | 0.958 | 83.9 |
| 6 | 1 | 0.50 | 0.08 | 0.990 | 0.954 | 82.4 |
| 7 | 1 | 0.15 | 0.01 | 0.993 | 0.962 | 27.9 |
| 8 | 1 | 0.15 | 0.01 | 0.993 | 0.962 | 27.9 |
| 9 | 1 | 0.15 | 0.01 | 0.993 | 0.962 | 27.9 |
| 10 | 1 | 0.15 | 0.002 | 0.993 | 0.965 | 14.9 |

| | WEIGHTING | | OFFSET-A | | OFFSET-B | |
|---|---|---|---|---|---|---|
| ITER | LDSR0 | LDSR90 | $R_{SQ}$ | SLOPE | $R_{SQ}$ | SLOPE |
| 0 | 1 | 1 | 0.986 | 1.011 | 0.452 | 1.210 |
| 1 | 1 | 0.01 | 0.999 | 0.976 | 0.942 | 1.020 |
| 2 | 1 | 0.010 | 0.999 | 0.976 | 0.943 | 1.020 |
| 3 | 1 | 0.009 | 0.999 | 0.977 | 0.944 | 1.021 |
| 4 | 1 | 0.008 | 0.999 | 0.978 | 0.949 | 1.024 |
| 5 | 1 | 0.005 | 0.999 | 0.982 | 0.963 | 1.039 |
| 6 | 1 | 0.003 | 0.999 | 0.990 | 0.975 | 1.065 |
| 7 | 1 | 0 | 0.998 | 1.007 | 0.941 | 1.114 |

| | WEIGHTING | | OFFSET-C | | OFFSET-D | |
|---|---|---|---|---|---|---|
| ITER | LDSR0 | LDSR90 | $R_{SQ}$ | SLOPE | $R_{SQ}$ | SLOPE |
| 0 | 1 | 1 | 0.023 | 0.367 | 0.094 | 0.696 |
| 1 | 1 | 0.01 | 0.925 | 1.030 | 0.873 | 0.891 |
| 2 | 1 | 0.010 | 0.926 | 1.029 | 0.874 | 0.892 |
| 3 | 1 | 0.009 | 0.927 | 1.028 | 0.877 | 0.894 |
| 4 | 1 | 0.008 | 0.930 | 1.026 | 0.885 | 0.901 |
| 5 | 1 | 0.005 | 0.940 | 1.016 | 0.909 | 0.931 |
| 6 | 1 | 0.003 | 0.939 | 1.006 | 0.925 | 0.988 |
| 7 | 1 | 0 | 0.851 | 1.012 | 0.884 | 1.151 |

| | WEIGHTING | | OFFSET-E | | AVERAGE $CHI^2$ |
|---|---|---|---|---|---|
| ITER | LDSR0 | LDSR90 | $R_{SQ}$ | SLOPE | |
| 0 | 1 | 1 | 0.823 | 1.043 | 20.4 |
| 1 | 1 | 0.01 | 0.990 | 0.974 | 2.1 |
| 2 | 1 | 0.010 | 0.990 | 0.975 | 2.1 |
| 3 | 1 | 0.009 | 0.991 | 0.975 | 2.0 |
| 4 | 1 | 0.008 | 0.991 | 0.978 | 1.9 |
| 5 | 1 | 0.005 | 0.993 | 0.989 | 1.6 |
| 6 | 1 | 0.003 | 0.994 | 1.008 | 1.4 |
| 7 | 1 | 0 | 0.994 | 1.056 | 1.0 |

MEASUREMENT LIBRARY OPTIMIZATION IN SEMICONDUCTOR METROLOGY

CROSS REFERENCE TO RELATED APPLICATION

The present application for patent claims priority under 35 U.S.C. § 119 from U.S. provisional patent application Ser. No. 62/180,517, entitled "Maximum Likelihood Based Optimization Framework for Library-based Critical Dimensions Measurement in Semiconductor Process," filed Jun. 16, 2016, the subject matter of which is incorporated herein by reference in its entirety.

TECHNICAL FIELD

The described embodiments relate to metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Optical metrology processes are used at various steps during a semiconductor manufacturing process to detect defects on wafers to promote higher yield. Optical metrology techniques offer the potential for high throughput without the risk of sample destruction. A number of optical metrology based techniques including scatterometry and reflectometry implementations and associated analysis algorithms are commonly used to characterize critical dimensions, film thicknesses, composition and other parameters of nanoscale structures.

As devices (e.g., logic and memory devices) move toward smaller nanometer-scale dimensions, characterization becomes more difficult. Devices incorporating complex three-dimensional geometry and materials with diverse physical properties contribute to characterization difficulty.

In response to these challenges, more complex optical tools have been developed. Multiple, different measurement technologies are available, and measurements are performed over a large ranges of several machine parameters (e.g., wavelength, azimuth and angle of incidence, etc.), and often simultaneously. As a result, the measurement time, computation time, and the overall time to generate reliable results, including the synthesis of measurement libraries, increases significantly.

Library based measurements employ one or more pre-computed functional models that relate values of parameters of interest to measurement data (e.g., spectra). The pre-computed functional model approximates the solution of Maxwell's equations for a given set of parameter values. The library is synthesized from training data prepared by theoretical analysis and calculation of subsystem configuration, signal sensitivities, geometric models, etc. The process of building a measurement library is expensive in time and computational effort.

In many instances, the measurement library is validated based on measured reference data. Reference measurement data is typically collected from trusted measurement instruments, such as a transmission electron microscope, a scanning electron microscope, an atomic force microscope, scanning tunneling microscope, an x-ray based metrology system, etc., and the results are compared with estimates provided by the measurement library.

Typically, the estimates provided by the measurement library do not match the reference data within specified margins for early measurement library iterations. The synthesis of the measurement library often does not involve a significant amount of real fabrication process knowledge. This leads to modeling inaccuracies in early measurement library iterations that must be corrected. Thus, additional effort must be expended to study the root cause, modify the geometric model, and regenerate the library. This results in a substantial loss of time and computational effort. In addition, measured reference data is typically available only at the very late stages of a development cycle. Thus, the delays associated with library regeneration have a significant impact of production schedules.

As the available range of optical metrology measurement subsystems and associated recipes has increased, so has the complexity of the measurement selection process. Improved methods and tools to optimize the use of precomputed library functions to perform accurate library based measurements are desired.

SUMMARY

Methods and systems for optimizing a set of measurement library control parameters for a particular metrology application are presented herein. The metrology application includes the measurement of structural and material characteristics (e.g., material composition, dimensional characteristics of structures and films, etc.) associated with different semiconductor fabrication processes.

In one aspect, the library control parameters are optimized such that differences between reference measurements of one or more parameters of interest of one or more metrology targets and estimated values of the parameters of interest are minimized. Measurement signals (e.g., measured spectra) are collected by a target measurement system from the same metrology target(s) measured by the reference metrology system. The estimated values of the parameters of interest are resolved by fitting a pre-computed measurement library function to the measurement signals for a given set of library control parameters. In some embodiments, the values of the library control parameters are iteratively evolved until a cost function that characterizes the differences between reference measurements and estimated values of the parameters of interest passes a predetermined threshold value. Importantly, the optimization of the library control parameter values is performed without recalculating the pre-computed measurement library.

In a further aspect, the optimized set of measurement library control parameters is subsequently employed by the target measurement system to perform measurements of similar targets using the same measurement library, but with optimized library control parameter values. In this manner, improved measurement performance is achieved without regenerating the measurement library.

In another further aspect, a maximum likelihood based approach is employed to arrive at library control parameter values that increase the accuracy of library based measurements (e.g., critical dimension measurements). The maximum likelihood based approach efficiently optimizes the library control parameter values to improve the fitting quality of the library measurement to reference measurement data without regenerating the measurement library. This approach significantly reduces the development time necessary to achieve satisfactory measurement accuracy for a given metrology application.

In some embodiments, the reference measurement data is generated by a trusted reference measurement system, such as a transmission electron microscope, a scanning electron microscope, an atomic force microscope, a scanning tunneling microscope, an x-ray based metrology system, or any combination thereof.

In some embodiments, the library control parameters include measurement subsystem combination weights, measurement signal weights, one or more specimen parameters fixed to specific values, one or more constraints on floating parameter values, or any combination thereof.

The target measurement system may include many different measurement system configurations such as a spectroscopic ellipsometer configuration, a spectroscopic reflectometer configuration, a single-wavelength ellipsometer configuration, a single wavelength reflectometer configuration, a beam profile ellipsometer configuration, a beam profile reflectometer configuration, or any combination thereof.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Model based optical measurement of critical dimensions (CDs), thin film thicknesses, optical properties and material compositions, overlay, lithography focus/dose, etc., typically requires a geometric model of the underlying structure to be measured. Thus, a measurement model includes the physical dimensions, material properties, and parameterization of the structure. In some embodiments, the measurement model is constructed from a file that contains equations representative of the geometric features of the structure to be measured. In some embodiments, this file is generated by a lithography simulator such as PROLITH software available from KLA-Tencor Corporation, Milpitas, Calif. (USA). The measurement model sets the parameterization and constraints of the measurement model based on this application information.

The measurement model includes machine parameter values and specimen parameter values that depend on the particular measurement system and metrology target under consideration. In one example, the SpectraShape™ 10K metrology tool available from KLA-Tencor, Corporation, Milpitas, Calif. (USA), offers three different angles of incidence, an arbitrary selection of azimuth angle, selectable wavelength range, and more than one collection angle. Such a metrology tool offers a wide range of measurement subsystem options (e.g., spectroscopic ellipsometry and spectroscopic reflectometry) and measurement signal options. Each of these options may be particularly sensitive to some geometric parameters of the metrology target and not particularly sensitive to others.

In a library generation phase, a measurement library is generated based on a set of training data derived from simulations of a particular measurement scenario. Typically, an electromagnetic system model corresponding to the particular measurement system configuration and metrology target(s) under measurement is simulated. In some embodiments, the measurement library is a neural network model trained on the set of training data. The trained measurement library is a fast mathematical approximation of the solution of the simulated electromagnetic system for a given set of model parameter values. In a measurement phase, the precomputed measurement library is employed to estimate parameter values from measured data (e.g., measured spectra) by recursion. More specifically, an iterative fitting procedure is employed to fit measurement data predicted by the library based on estimated model parameter values to actual measurement data. The estimated model parameter values include the parameters of interest under measurement (e.g., critical dimensions, film thicknesses, etc.).

During the measurement phase, a number of library control parameters dictate the configuration of the measurement library itself and how the precomputed measurement library handles measured data provided to the library. Library control parameters are selectable without regenerating the measurement library. Thus, selection of library control parameter values affects library based measurement results without library regeneration. Library control parameters include, but are not limited to, measurement subsystem combination weights, measurement signal weights, fixed parameter values, and constraints on floating parameter values, etc. Due to the increased number of measurement subsystem options and measurement signal options, and the increased complexity of metrology targets, an automated and systematic approach to the selection of library control parameter values is important.

Methods and systems for optimizing a set of measurement library control parameters for a particular metrology application are presented herein. The metrology application includes the measurement of structural and material characteristics (e.g., material composition, dimensional characteristics of structures and films, etc.) associated with different semiconductor fabrication processes. The optimization of the library control parameters minimizes differences between reference measurement data collected from one or more metrology targets by a reference metrology system and measurement signals (e.g., measured spectra) collected from the same metrology target(s) by a target metrology system that employs the measurement library. The optimized set of measurement library control parameters is subsequently employed by the target measurement system to perform measurements of similar targets using the same measurement library. In this manner, improved measurement performance is achieved without regenerating the measurement library.

In one aspect, a maximum likelihood based approach is employed to arrive at library control parameter values that increase the accuracy of library based measurements (e.g., critical dimension measurements). The maximum likelihood based approach efficiently optimizes the library control parameter values to improve the fitting quality of the library measurement to reference measurement data without regenerating the measurement library. This approach significantly reduces the development time necessary to achieve satisfactory measurement accuracy for a given metrology application.

Figure 1:
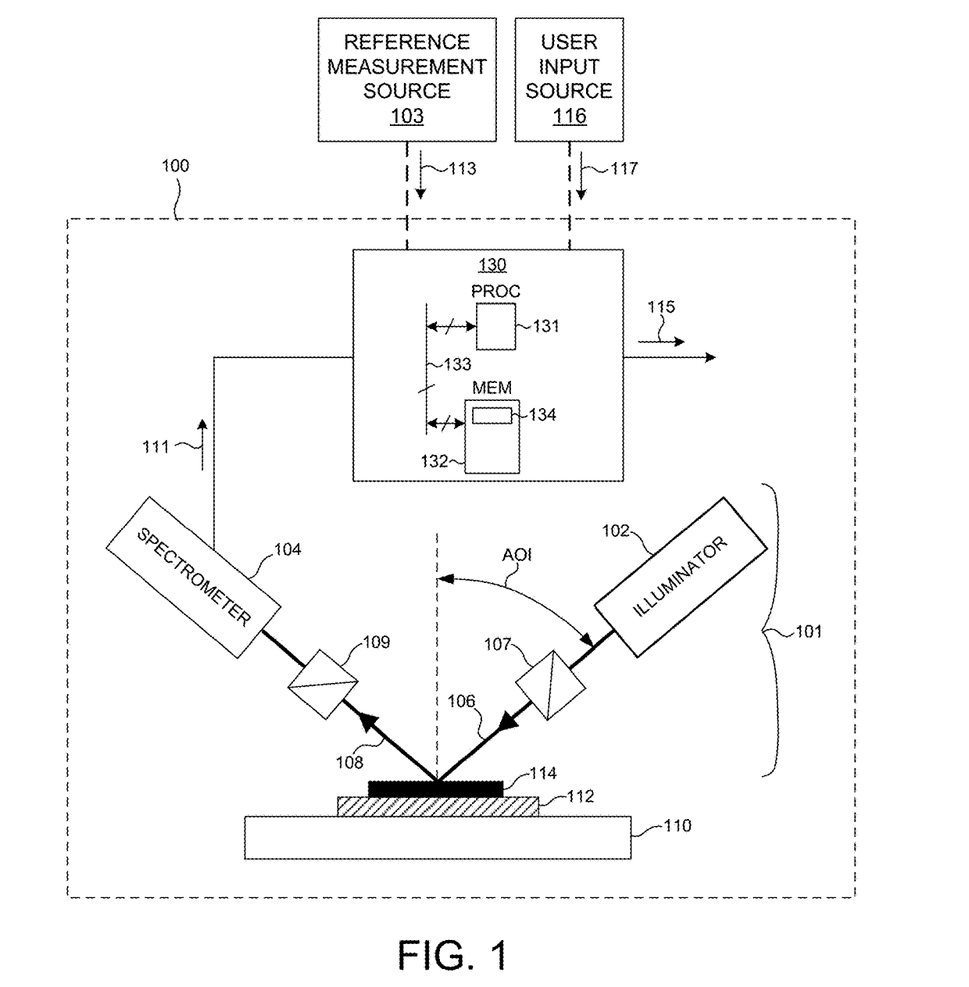
FIG. 1 is a diagram illustrative of a system 100 for measuring characteristics of a semiconductor wafer in accordance with the methods described herein.

FIG. 1 illustrates a system 100 for measuring characteristics of a semiconductor wafer. As shown in FIG. 1, the system 100 may be used to perform spectroscopic ellipsometry measurements of one or more structures 114 of a semiconductor wafer 112 disposed on a wafer positioning system 110. In this aspect, the system 100 may include a spectroscopic ellipsometer 101 equipped with an illuminator 102 and a spectrometer 104. The illuminator 102 of the system 100 is configured to generate and direct illumination of a selected wavelength range (e.g., 120-1700 nm) to the structure 114 disposed on the surface of the semiconductor wafer 112. In turn, the spectrometer 104 is configured to receive light from the surface of the semiconductor wafer 112. It is further noted that the light emerging from the illuminator 102 is polarized using a polarization state generator 107 to produce a polarized illumination beam 106. The radiation reflected by the structure 114 disposed on the wafer 112 is passed through a polarization state analyzer 109 and to the spectrometer 104. The radiation received by the spectrometer 104 in the collection beam 108 is analyzed with regard to polarization state, allowing for spectral analysis of radiation passed by the analyzer. These spectra 111 are passed to the computing system 116 for analysis of the structure 114.

In a further embodiment, the metrology system 100 is a measurement system 100 that includes one or more computing systems 130 configured to execute an automated measurement library control parameter optimization (AMLCPO) tool in accordance with the description provided herein. In the preferred embodiment, the AMLCPO tool is a set of program instructions 134 stored in a memory (e.g., memory 132 or an external memory). The program instructions 134 are read and executed by one or more processors of computing system 130 to realize library control parameter optimization functionality as described herein. Computing system 130 may be communicatively coupled to the spectrometer 104. In one aspect, computing system 130 is configured to receive measurement data 111 associated with a measurement (e.g., critical dimension, film thickness, composition, process, etc.) of the structure 114 of specimen 112. In one example, the measurement data 111 includes an indication of the measured spectral response of the specimen by measurement system 100 based on the one or more sampling processes from the spectrometer 104. In some embodiments, computing system 130 is further configured to determine specimen parameter values of structure 114 from measurement data 111. In one example, the computing system 130 is configured to access one or more measurement libraries of pre-computed models for determining a value of at least one specimen parameter value associated with the target structure 114. In some examples, the measurement libraries are stored in memory 132.

Computing system 130 is configured to receive reference measurement data 113 from a reference measurement source 103. In some embodiments, the reference measurement source 103 is any trusted measurement instrument, such as a transmission electron microscope, a scanning electron microscope, an atomic force microscope, a scanning tunneling microscope, an x-ray based metrology system, etc., employed to measure one or more parameters of interest of the structure 114 of specimen 112. In some embodiments, the reference measurement source is any trusted measurement model, such as a computational model that is sufficiently accurate, but too computationally burdensome for use in the course of high-throughput metrology. The reference measurement data combined with the estimated values of the same parameters of interest determined by library-based metrology system 100 provide the input data required for library control parameter optimization. In addition, in some embodiments, computing system 130 is further configured to receive user input 117 from a user input source 116 such as a graphical user interface, keyboard, etc. In some embodiments, user input 117 includes an indication of the parameters of interest selected by the user to form the basis of the library control parameter optimization. For example, a user may interact with a graphical user interface (GUI) that allows the user to select a particular critical dimension as the parameter of interest. Based on an indication of this particular critical dimension, computing system 130 performs an optimization of the library control parameters that results in an optimal match between reference measurements of the particular critical dimension and estimated values of the same critical dimension determined by the library-based metrology system.

In some embodiments, measurement system 100 is further configured to store one or more optimized library control parameter values 115 in a memory (e.g., memory 132 or an external memory).

It should be recognized that the various steps described throughout the present disclosure may be carried out by a single computer system 130 or, alternatively, a multiple computer system 130. Moreover, different subsystems of the system 100, such as the spectroscopic ellipsometer 101, may include a computer system suitable for carrying out at least a portion of the steps described herein. Therefore, the aforementioned description should not be interpreted as a limitation on the present invention but merely an illustration. Further, computing system 130 may be configured to perform any other step(s) of any of the method embodiments described herein.

The computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium. In general, computing system 130 may be integrated with a measurement system such as measurement system 100, or alternatively, may be separate from any measurement system. In this sense, computing system 130 may be remotely located and receive measurement data, reference measurement data 113, and user input 117 from any measurement source, reference measurement source, and user input source, respectively.

Program instructions 134 implementing methods such as those described herein may be transmitted over a transmission medium such as a wire, cable, or wireless transmission link. Memory 132 storing program instructions 134 may include a computer-readable medium such as a read-only memory, a random access memory, a magnetic or optical disk, or a magnetic tape.

In addition, the computer system 130 may be communicatively coupled to the spectrometer 104 or the illuminator subsystem 102 of the ellipsometer 101, or the user input source 103 in any manner known in the art.

The computing system 130 may be configured to receive and/or acquire data or information from the user input source 103 and subsystems of the system (e.g., spectrometer 104, illuminator 102, and the like) by a transmission medium that may include wireline and/or wireless portions. In this manner, the transmission medium may serve as a data link between the computer system 130, user input source 103, and other subsystems of the system 100. Further, the computing system 130 may be configured to receive measurement data via a storage medium (i.e., memory). For instance, the spectral results obtained using a spectrometer of ellipsometer 101 may be stored in a permanent or semi-permanent memory device (not shown). In this regard, the spectral results may be imported from an external system. Moreover, the computer system 130 may send data to external systems via a transmission medium.

The embodiments of the system 100 illustrated in FIG. 1 may be further configured as described herein. In addition, the system 100 may be configured to perform any other block(s) of any of the method embodiment(s) described herein.

In general, ellipsometry is an indirect method of measuring physical properties of the specimen under inspection. In most cases, the measured values (e.g., $\alpha_{meas}$ and $\beta_{meas}$) cannot be used to directly determine the physical properties of the specimen. The nominal measurement process consists of parameterization of the structure (e.g., film thicknesses, critical dimensions, etc.) and the machine (e.g., wavelengths, angles of incidence, polarization angles, etc.). A measurement model is created that attempts to predict the measured values (e.g., $\alpha_{meas}$ and $\beta_{meas}$). As illustrated in equations (1) and (2), the measurement model includes parameters associated with the machine ($P_{machine}$) and the specimen ($P_{specimen}$).

$$\alpha_{model} = f(P_{machine}, P_{specimen}) \quad (1)$$

$$\beta_{model} = g(P_{machine}, P_{specimen}) \quad (1)$$

Machine parameters are parameters used to characterize the metrology tool (e.g., ellipsometer 101). Exemplary machine parameters include angle of incidence (AOI), analyzer angle ($A_O$), polarizer angle ($P_O$), illumination wavelength, numerical aperture (NA), etc. Specimen parameters are parameters used to characterize the specimen (e.g., specimen 112 including structures 114). For a thin film specimen, exemplary specimen parameters include refractive index, dielectric function tensor, nominal layer thickness of all layers, layer sequence, etc. For measurement purposes, the machine parameters are treated as known, fixed parameters and one or more of the specimen parameters are treated as unknown, floating parameters.

In some examples, the floating parameters are resolved by an iterative process (e.g., regression) that produces the best fit between theoretical predictions provided by a measurement library and experimental data. The unknown specimen parameters, $P_{specimen}$ are varied and the model output values (e.g., ($\alpha_{model}$ and $\beta_{model}$) are estimated until a set of specimen parameter values are determined that results in a close match between the model output values and the experimentally measured values (e.g., ($\alpha_{meas}$ and $\beta_{meas}$). In some examples, the floating parameters are resolved by a search through a library of pre-computed solutions to find the closest match. In a model based measurement application such as spectroscopic ellipsometry on a CD specimen, a library search process is employed to identify specimen parameter values that minimize the differences between pre-computed output values and the experimentally measured values for a fixed set of machine parameter values.

In a library-based measurement application, the selection of library control parameters affects the accuracy of measurement results. In some embodiments, the library control parameters include measurement subsystem combination weights, measurement signal weights, one or more specimen parameters fixed to specific values, one or more constraints on floating parameter values, or any combination thereof.

In some examples, a particular metrology target is subjected to measurement by multiple, different measurement subsystems. Measurement data is collected from each of the multiple, different measurement subsystems. Relative weights are applied to the measurement data collected by each different measurement subsystem. The weighted measurement data is processed by the measurement library, or combination of measurement libraries to arrive at an estimated value of a parameter of interest. In another example, a measurement system generates multiple, different measurement signals associated with a measurement of a particular metrology target. Relative weights are applied to each different measurement signal generated by each measurement system. The weighted measurement signal data is processed by the measurement library, or combination of measurement libraries to arrive at an estimated value of a parameter of interest. In another example, one or more of the floating parameters resolved by the measurement library (e.g., one or more of the parameters, $P_{specimen}$ illustrated in equations (1) and (2)) is set to a fixed value during measurement. In yet another example, one or more of the floating parameters resolved by the measurement library is constrained during measurement. In one example, a functional relationship is established between two floating parameters (e.g., $P_{specimen} = f(P_{specimen2})$). Thus, the values of the two input parameters are constrained by the functional relationship during the library search phase of the measurement.

Figure 2:
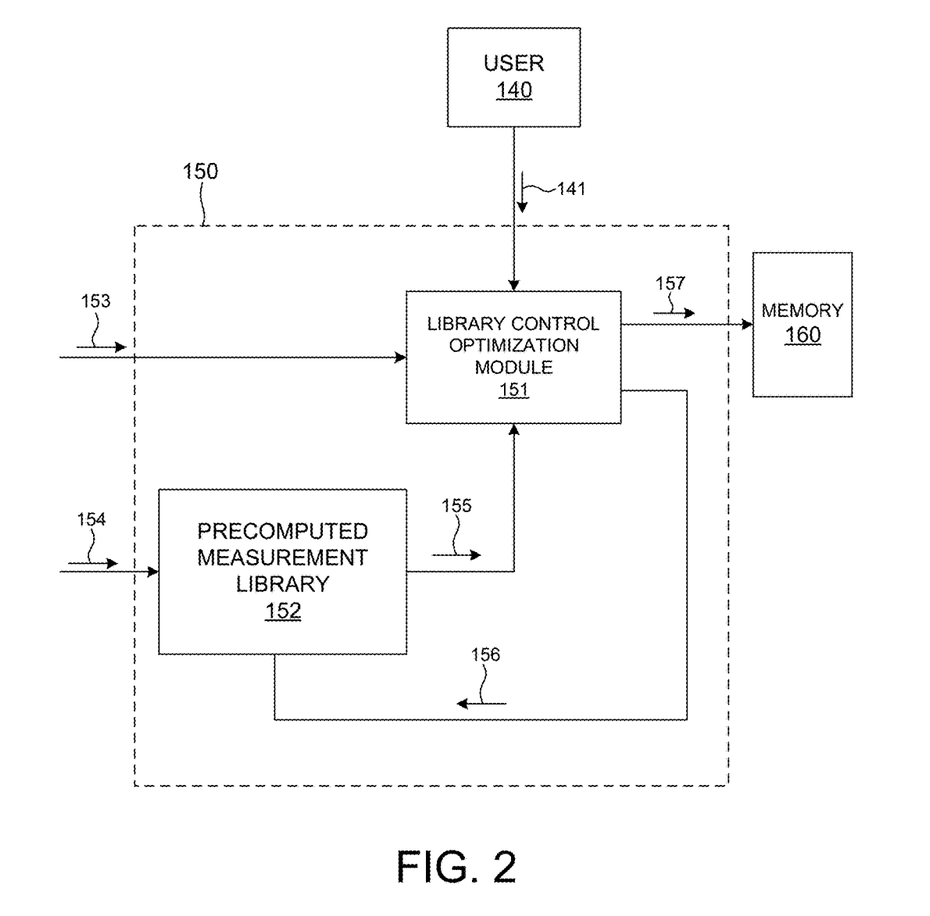
FIG. 2 is a diagram illustrative of an exemplary automated measurement library control parameter optimization (AMLCPO) tool 150 implemented by computing system 130 depicted in FIG. 1.

FIG. 2 is a diagram illustrative of an exemplary AMLCPO tool 150 implemented by computing system 130. In the embodiment depicted in FIG. 2, computing system 130 is configured to implement automated library control parameter optimization functionality as described herein.

In the embodiment depicted in FIG. 2, AMLCPO tool 150 includes a precomputed measurement library 152 and a library control optimization module 151. AMLCPO tool 150 receives an indication 141 of one or more parameters of interest selected by a user 140 (e.g., a particular critical dimension of a metrology target under measurement). Precomputed measurement library 152 receives measured signals 154 (e.g., measured spectra) associated with a measurement of a particular metrology target (e.g., a structure 114 fabricated on specimen 112) by a target measurement system (e.g., metrology system 100). The precomputed measurement library 152 estimates values of the selected parameter of interest (e.g., the critical dimension parameter selected by the user 140) based on the measured signals 154 and a predetermined (e.g., default) set of library control parameter values. Precomputed measurement library 152 communicates an indication 155 of the estimated values of the selected parameter of interest to the library control optimization module 151. The library control optimization module 151 also receives an indication 153 of the values of the selected parameters of interest as measured by a reference measurement system. The reference measurement system performs measurements of the same metrology targets as the target measurement system. Library control optimization module determines a new set of library control parameter values based on the reference measurements 153 of the selected parameters of interest and the estimated values of the selected parameters of interest 155. An indication 156 of the new set of library control parameters is communicated from library control optimization module 151 to the precomputed measurement library 152. The precomputed measurement library 152 estimates values of the selected parameter of interest based on the measured signals 154 and the new set of library control parameter values. The updated values of the selected parameters of interest are communicated to library control optimization module 151. Precomputed measurement library 152 communicates an indication 155 of the estimated values of the selected parameter of interest to the library control optimization module 151. Library control optimization module determines another new set of library control parameter values based on the reference measurements 153 of the selected parameters of interest and the estimated values of the selected parameters of interest 155. This process is iterated until a satisfactory match between the reference measurements 153 of the selected parameters of interest and the estimated values of the selected parameters of interest is achieved.

An indication 157 of the set of library control parameter values that achieves a satisfactory match is stored in a memory (e.g., memory 160). Subsequent measurements of similar metrology targets may be performed by the target measurement system using the precomputed measurement library 152 with the optimized set of library control parameters. Such measurements may be employed as part of a high-throughput, in-line metrology tool. Alternatively, the measurements may be employed as part of the modeling and design of metrology systems, the modeling and design of metrology targets, or both.

Library control optimization module 151 searches for library control parameter values such that the library-based measurement of user selected parameters of interest closely matches the value of these parameters of interest as measured by a trusted reference measurement system.

In some embodiments, the cost function for the optimization is defined as a least squares error of one or more metrics that characterize the fit between reference data and corresponding library-based measurement data. In one example, the fit is characterized by the slope and $R^2$ values corresponding to the fit between reference data and corresponding library-based measurement data. Equation (3) illustrates an exemplary cost function including both metrics.

$$CostFuncion = \sum_{i=0}^{N} (1 - R_{POI_i}^2)^2 + \sum_{i=0}^{N} (1 - \text{Slope}_{POI_i})^2 \quad (3)$$

In one example, a maximum likelihood estimation is employed to optimize the library control parameters. In this example, library control optimization module 151 characterizes the fitting quality by evaluating the cost function illustrated by equation (3).

Figure 3:
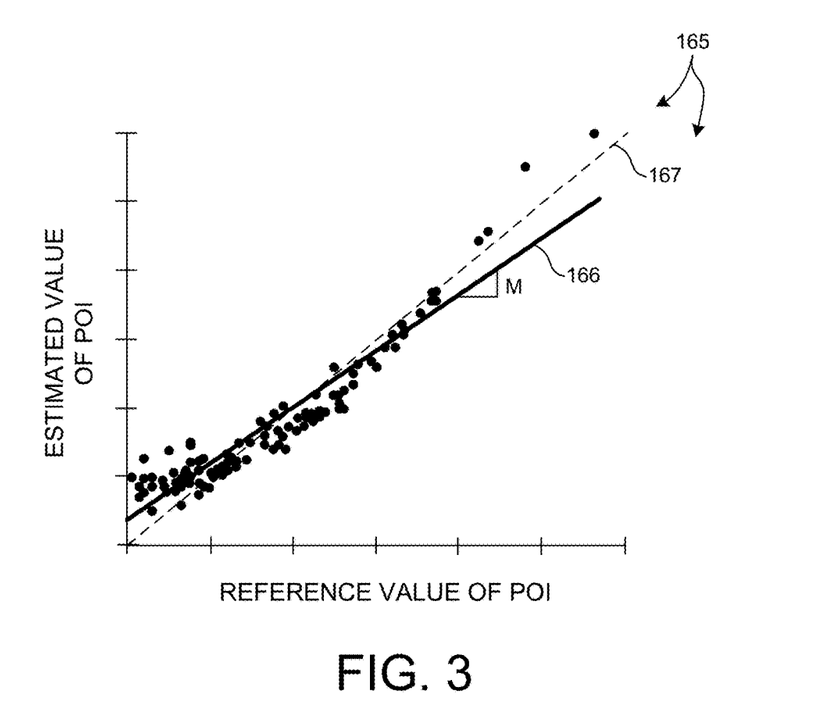
FIG. 3 depicts a plot 165 of estimated values and corresponding reference values of a parameter of interest.

FIG. 3 depicts an illustrative plot 165 of estimated values of a parameter of interest (POI) (e.g., values 155 depicted in FIG. 2) and corresponding values of the parameter of interest as measured by a reference measurement system (e.g., values 153 depicted in FIG. 2). If the estimated values of the parameter of interest perfectly matched the corresponding known values, all points would lie on line 167. In reality, there are discrepancies. Line 166 represents a linear fit to the data points.

In some examples, library control optimization module 151 determines the slope of the regression line of the data points (e.g., line 166 depicted in FIG. 3).

In some examples, library control optimization module 151 determines the $R^2$ value (i.e., coefficient of determination) associated with the differences between the estimated values of the parameter of interest and the known values of the parameter of interest. The range of $R^2$ values is between zero and one, with one being a perfect fit between the estimated values of the parameter of interest and the known values of the parameter of interest for each measurement. In some examples, the $R^2$ value is calculated as illustrated in equation (6).

$$R^2 = 1 - \frac{\sum_{i=1}^{N} e_i^2}{\frac{1}{N} \sum_{i=1}^{N} y_{est_i}} \quad (4)$$

The estimated value of the parameter of interest is denoted a $y_{est_i}$ and the reference value of the parameter of interest is denoted as $y_{known_i}$, and $e_i$ is defined by equation (5).

$$e_i = y_{est_i} - y_{known_i} \quad (5)$$

In this example, library control optimization module 151 perturbs each library control parameter to be optimized and calculates the numerical Jacobian of the residue with respect to each library control parameter to be optimized. The determined sensitivities are employed by library control optimization module 151 to determine an updated value of each library control parameter to be optimized. Various methods may be employed to update the parameter values. By way of non-limiting example, any of the Levenberg-Marquardt method, the gradient decent method, the Gaussian-Newton methods, etc., may be employed by library control optimization module 151.

The updating of the library control parameter values is performed iteratively until a stop condition is achieved. In one example, a stop condition is achieved when measurement accuracy, defined as the 3σ value of the difference between the estimated value of the parameter of interest and the reference value of the parameter of interest, reaches a predetermined threshold value. In one example, accuracy is defined by equation (6), where the mean value of differences between the estimated values and reference values is defined by equation (7).

$$\text{Accuracy} = 3\sigma = 3\sqrt{\frac{1}{N}\sum_{i=1}^{N} e_i - \overline{e}} \quad (6)$$

$$\overline{e} = \frac{1}{N}\sum_{i=1}^{N} e_i \quad (7)$$

In general, any number of parameters of interest may be selected and provide the basis for library control parameter optimization. Exemplary parameters of interest include geometric parameters such as a shape parameter such as a critical dimension (CD), sidewall angle (SWA), height (H), etc., composition, film thickness, bandgap, electrical properties, lithography focus, lithography dosage, overlay, and other process parameters (e.g., resist state, partial pressure, temperature, focusing model).

In general, any one, or combination, of library control parameters may be subject to optimization. Thus, measurement subsystem combination weights, measurement signal weights, fixed parameter values, parameter constraints, or any combination thereof may be optimized. Moreover, the optimization of each library control parameter may be conducted independently or together in a cascaded optimization framework.

Figure 4:
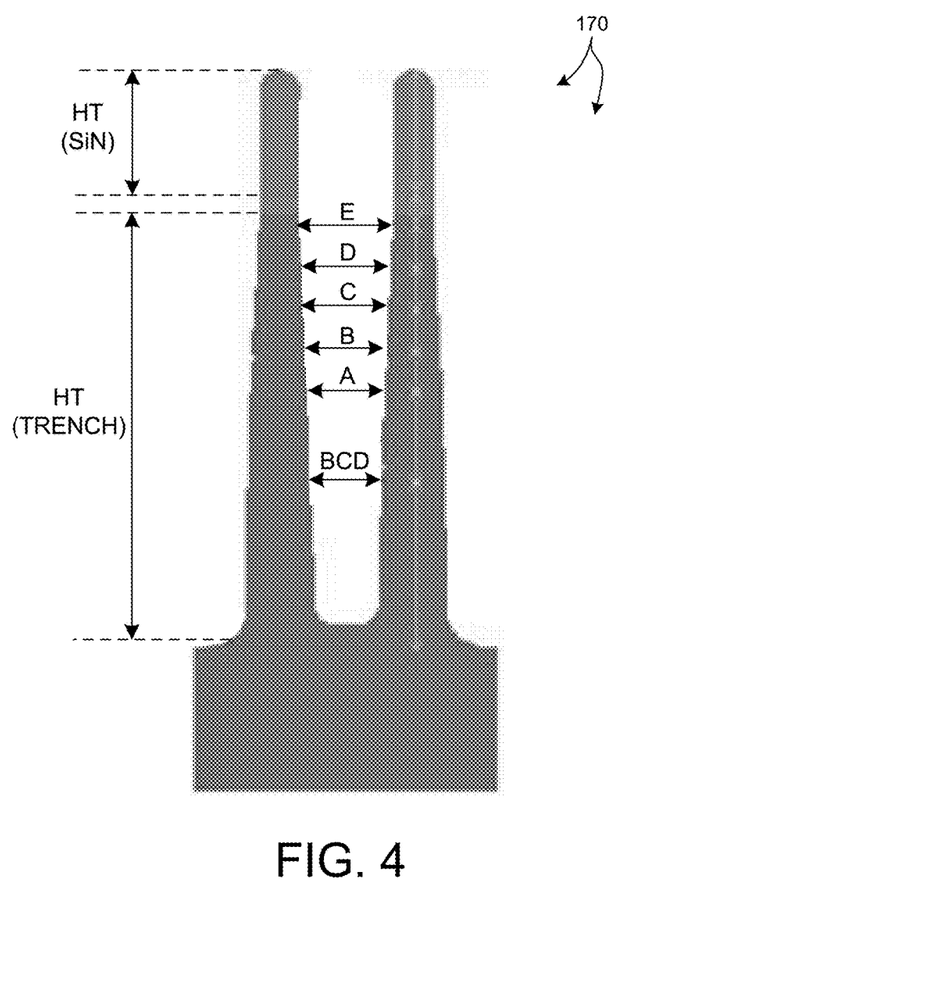
FIG. 4 depicts a diagram of a metrology target 170 to be measured, for example, by measurement system 100 depicted in FIG. 1. Geometric parameters of interest include critical dimension (CD) offsets A-E.

For illustrative purposes, FIG. 4 depicts a metrology target 170 to be measured. Geometric parameters of interest include critical dimension (CD) offsets A-E. CD offset A is the difference between critical dimension, A, and trench bottom critical dimension, BCD, depicted in FIG. 4. Similarly, CD offset B is the difference between critical dimension, B, and trench bottom critical dimension, BCD, depicted in FIG. 4, etc. CD offsets A-E are similar and difficult to be measure. A combination of different spectroscopic ellipsometer and reflectometer techniques are employed to measure these parameters of interest.

In one example, four different measurement system combinations are employed to measure the CD offsets A-E. The measurement system combinations are a rotating polarizer spectroscopic ellipsometer at an azimuth angle of zero degrees, a rotating polarizer spectroscopic ellipsometer at an azimuth angle of ninety degrees, a laser driven spectroscopic reflectometer at a polarizer angle of zero degrees, and a laser driven spectroscopic reflectometer at a polarizer angle of ninety degrees.

Figure 5A:
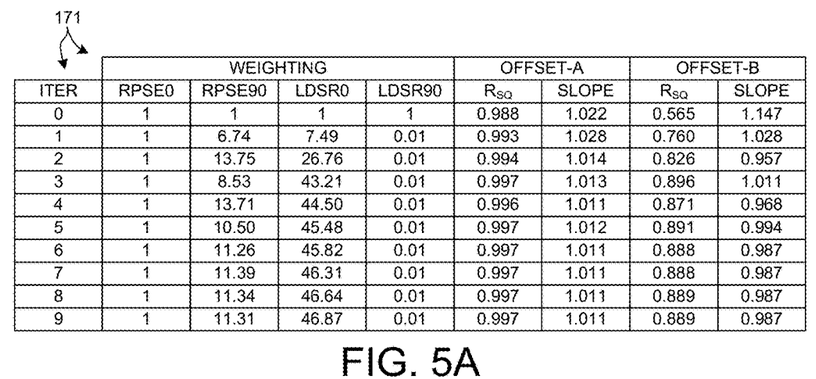
FIGS. 5A-5C depict tables 171-173, indicative of the differences between reference data associated with CD offsets A-E and values of CD offsets A-E estimated by library-based measurement for ten different weightings among four different measurement system combinations.
Figure 5B:
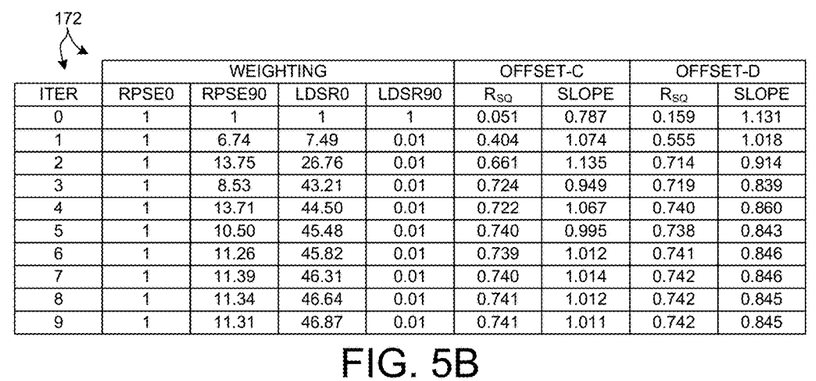
Figure 5C:
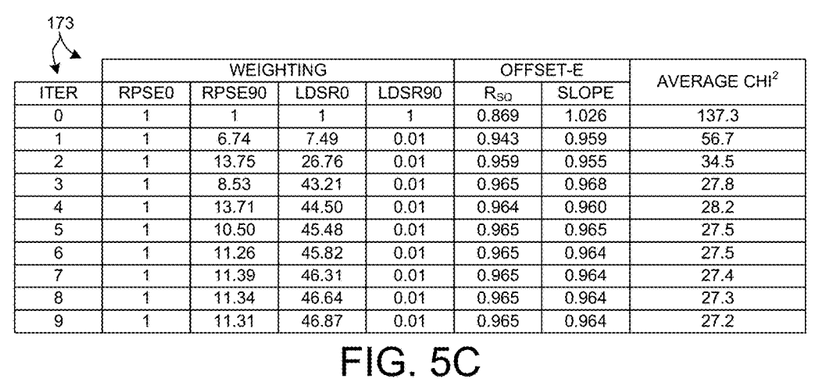

FIGS. 5A-5C depict tables 171-173, indicative of the differences between reference data associated with CD offsets A-E and values of CD offsets A-E estimated by library-based measurement for ten different weightings among the four different measurement system combinations described in this example. Table 171 indicates the fitting quality (i.e., $R^2$ and slope) between the reference data and the library-based measurement for CD offset A and CD offset B. Table 172 indicates the fitting quality (i.e., $R^2$ and slope) between the reference data and the library-based measurement for CD offset C and CD offset D. Table 173 indicates the fitting quality (i.e., $R^2$ and slope) between the reference data and the library-based measurement for CD offset E and the average goodness of fit (i.e., $Chi^2$ value) associated with CD offsets A-E for each different weighting.

As illustrated in FIGS. 5A-5B, each fit associated with CD offsets B-D is quite poor when an equal weighting is applied across all four measurement subsystems. The AML-CPO tool 150 is iteratively applied to automatically recommend improved measurement subsystem weighting parameters. As illustrated in FIGS. 5A-5C, the fitting quality improves significantly and the average $Chi^2$ value is reduced the measurement subsystem weights are evolved in the manner described herein.

In another example, three different measurement system combinations are employed to measure the CD offsets A-E. The measurement system combinations are a laser driven spectroscopic reflectometer at a polarizer angle of zero degrees, a laser driven spectroscopic reflectometer at a polarizer angle of ninety degrees, and a rotating polarizer, rotating compensator spectroscopic ellipsometer at an azimuth angle of forty-five degrees.

Figure 6A:
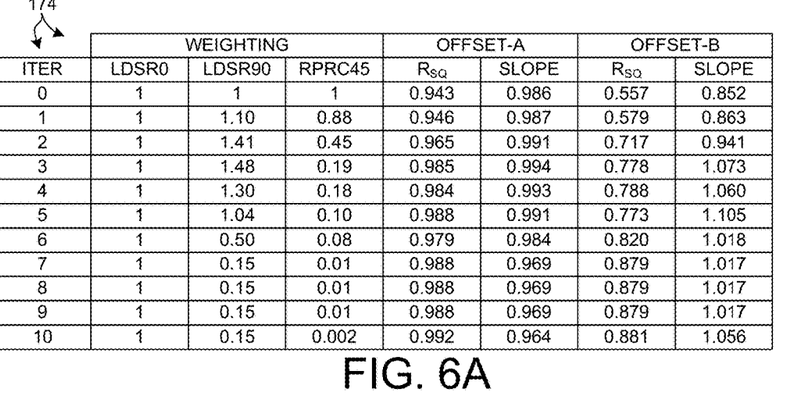
FIGS. 6A-6C depict tables 174-176, indicative of the differences between reference data associated with CD offsets A-E and values of CD offsets A-E estimated by library-based measurement for eleven different weightings among three different measurement system combinations.
Figure 6B:
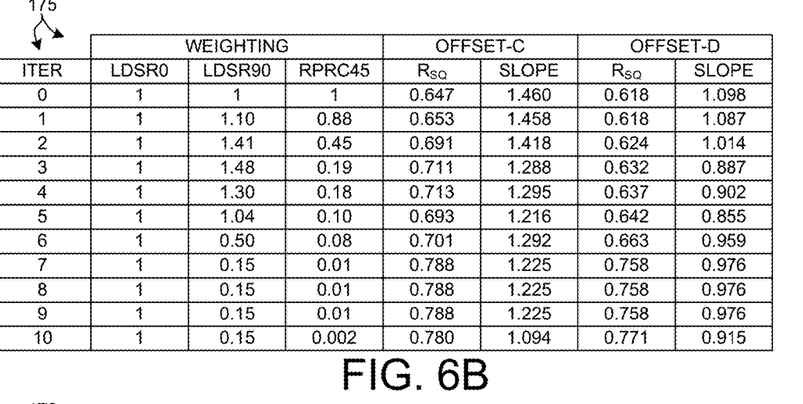
Figure 6C:
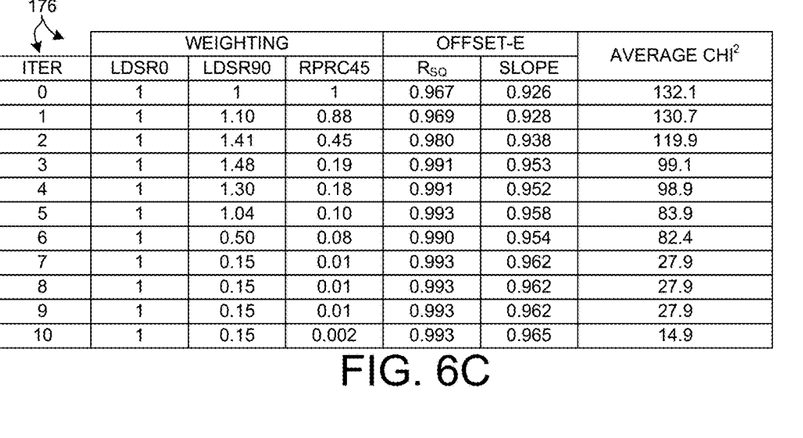

FIGS. 6A-6C depict tables 174-176, indicative of the differences between reference data associated with CD offsets A-E and values of CD offsets A-E estimated by library-based measurement for eleven different weightings among the three different measurement system combinations described in this example. Table 174 indicates the fitting quality (i.e., $R^2$ and slope) between the reference data and the library-based measurement for CD offset A and CD offset B. Table 175 indicates the fitting quality (i.e., $R^2$ and slope) between the reference data and the library-based measurement for CD offset C and CD offset D. Table 176 indicates the fitting quality (i.e., $R^2$ and slope) between the reference data and the library-based measurement for CD offset E and the average goodness of fit (i.e., $Chi^2$ value) associated with CD offsets A-E for each different weighting.

As illustrated in FIGS. 6A-6B, each fit associated with CD offsets B-D is quite poor when an equal weighting is applied across all three measurement subsystems. The AMLCPO tool 150 is iteratively applied to automatically recommend improved measurement subsystem weighting parameters. As illustrated in FIGS. 6A-6C, the fitting quality improves significantly and the average $Chi^2$ value is reduced the measurement subsystem weights are evolved in the manner described herein.

In yet another example, two different measurement system combinations are employed to measure the CD offsets A-E. The measurement system combinations are a laser driven spectroscopic reflectometer at a polarizer angle of zero degrees and a laser driven spectroscopic reflectometer at a polarizer angle of ninety degrees.

Figure 7A:
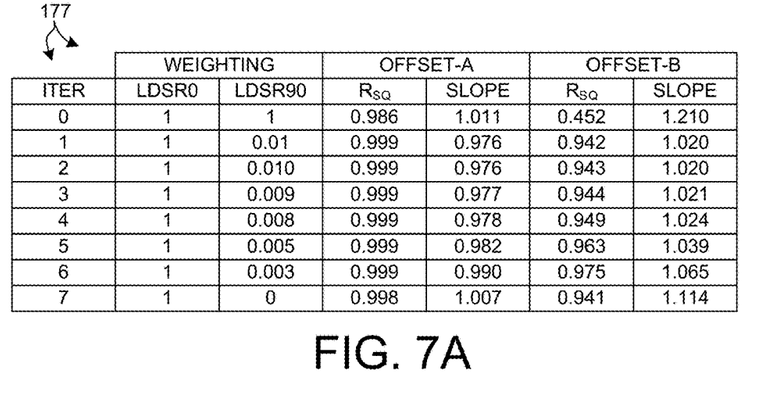
FIGS. 7A-7C depict tables 177-179, indicative of the differences between reference data associated with CD offsets A-E and values of CD offsets A-E estimated by library-based measurement for eight different weightings between two different measurement system combinations.
Figure 7B:
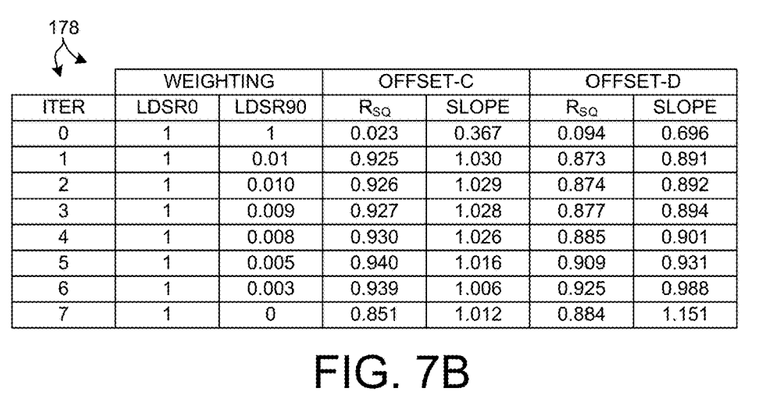
Figure 7C:
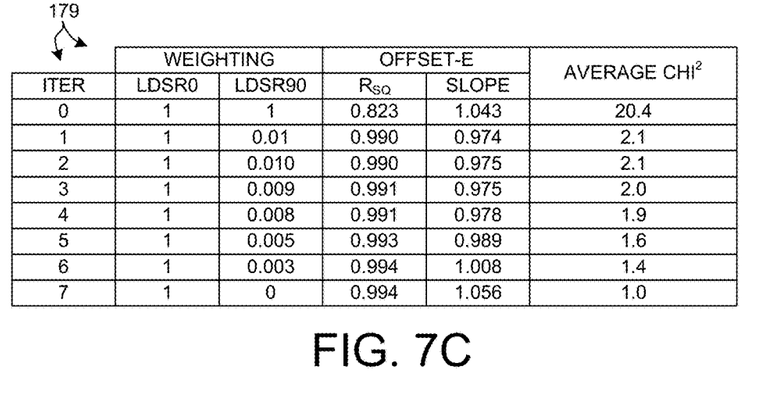

FIGS. 7A-7C depict tables 177-179, indicative of the differences between reference data associated with CD offsets A-E and values of CD offsets A-E estimated by library-based measurement for eight different weightings among the two different measurement system combinations described in this example. Table 177 indicates the fitting quality (i.e., $R^2$ and slope) between the reference data and the library-based measurement for CD offset A and CD offset B. Table 178 indicates the fitting quality (i.e., $R^2$ and slope) between the reference data and the library-based measurement for CD offset C and CD offset D. Table 179 indicates the fitting quality (i.e., $R^2$ and slope) between the reference data and the library-based measurement for CD offset E and the average goodness of fit (i.e., Chi² value) associated with CD offsets A-E for each different weighting.

As illustrated in FIGS. 7A-7B, each fit associated with CD offsets B-D shows very poor sensitivity when an equal weighting is applied across both measurement subsystems. The AMLCPO tool 150 is iteratively applied to automatically recommend improved measurement subsystem weighting parameters. As illustrated in FIGS. 7A-7C, the fitting quality improves significantly and the average Chi² value is reduced the measurement subsystem weights are evolved in the manner described herein. For example, the $R^2$ value associated with the measurement of CD offset C improves from 0.023 to 0.939 at iteration number six. Similarly, the slope improves from 0.367 to 1.006 at iteration number six.

Figure 8:
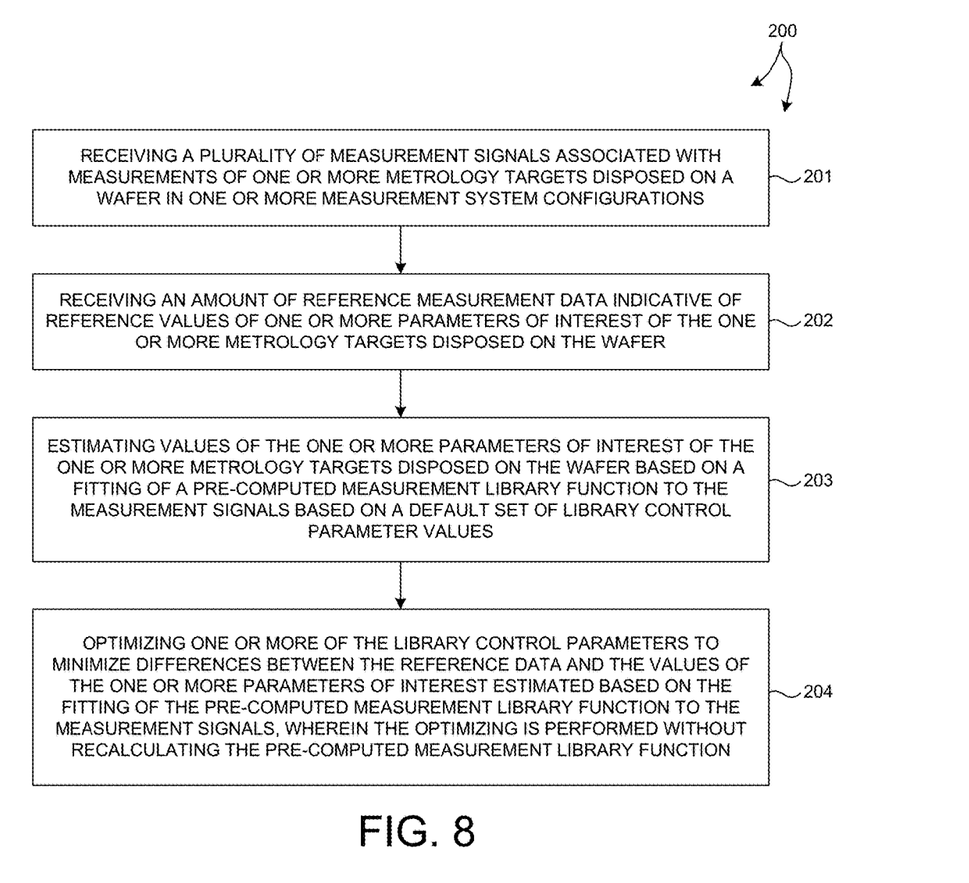
FIG. 8 illustrates a method 200 for optimizing library control parameter values for a particular metrology application in at least one novel aspect.

FIG. 8 illustrates a method 200 for optimizing a set of measurement library control parameters for a particular metrology application in at least one novel aspect. Method 200 is suitable for implementation by a metrology system such as metrology system 100 illustrated in FIG. 1 of the present invention. In one aspect, it is recognized that data processing blocks of method 200 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 201, a plurality of measurement signals associated with measurements of one or more metrology targets disposed on a wafer are received by a computing system (e.g., computing system 130). The measurement signals are associated with measurements performed in one or more measurement system configurations.

In block 202, an amount of reference measurement data indicative of reference values of one or more parameters of interest of the one or more metrology targets disposed on the wafer is received by a computing system (e.g., computing system 130).

In block 203, values of the one or more parameters of interest of the one or more metrology targets disposed on the wafer are estimated based on a fitting of a pre-computed measurement library function to the measurement signals. The pre-computed measurement library is controlled by a default set of library control parameter values for purposes of estimating the values of the one or more parameters of interest of the one or more metrology targets disposed on the wafer.

In block 204, one or more of the library control parameters are optimized to minimize differences between the reference data and the values of the one or more parameters of interest estimated based on the fitting of the pre-computed measurement library function to the measurement signals. The optimization is performed without recalculating the pre-computed measurement library function.

In an optional block (not shown), the optimized library control parameters are stored in a memory of a computing system (e.g., memory 132 of computing system 130 or an external memory).

Although the methods discussed herein are explained with reference to system 100, any library based metrology system configured to illuminate and detect light reflected, transmitted, or diffracted from a specimen may be employed to implement the exemplary methods described herein. Exemplary systems include an angle-resolved reflectometer, a scatterometer, a reflectometer, an ellipsometer, a spectroscopic reflectometer or ellipsometer, a beam profile reflectometer, a multi-wavelength, two-dimensional beam profile reflectometer, a multi-wavelength, two-dimensional beam profile ellipsometer, a rotating compensator spectroscopic ellipsometer, etc. By way of non-limiting example, an ellipsometer may include a single rotating compensator, multiple rotating compensators, a rotating polarizer, a rotating analyzer, a modulating element, multiple modulating elements, or no modulating element.

It is noted that the output from a reference source and/or target measurement system may be configured in such a way that the measurement system uses more than one technology. In fact, an application may be configured to employ any combination of available metrology sub-systems within a single tool, or across a number of different tools.

A system implementing the methods described herein may also be configured in a number of different ways. For example, a wide range of wavelengths (including visible, ultraviolet, infrared, and X-ray), angles of incidence, states of polarization, and states of coherence may be contemplated. In another example, the system may include any of a number of different light sources (e.g., a directly coupled light source, a laser-sustained plasma light source, etc.). In another example, the system may include elements to condition light directed to or collected from the specimen (e.g., apodizers, filters, etc.).

The invention presented herein addresses the problem of determining optimal library control parameters for a particular measurement application. In many cases, this problem is intractable without the aid of the methods and systems described herein. Moreover, the method described in this invention is not limited to the hardware and/or optical configuration summarized above.

In the field of semiconductor metrology, a metrology system may comprise an illumination system which illuminates a target, a collection system which captures relevant information provided by the illumination system's interaction (or lack thereof) with a target, device or feature, and a processing system which analyzes the information collected using one or more algorithms. Metrology tools can be used to measure structural and material characteristics (e.g, material composition, dimensional characteristics of structures and films such as film thickness and/or critical dimensions of structures, overlay, etc.) associated with various semiconductor fabrication processes. These measurements are used to facilitate process controls and/or yield efficiencies in the manufacture of semiconductor dies.

A metrology system can comprise one or more hardware configurations which may be used in conjunction with certain embodiments of this invention to, e.g., measure the various aforementioned semiconductor structural and material characteristics. Examples of such hardware configurations include, but are not limited to, the following: a spectroscopic ellipsometer (SE), a SE with multiple angles of illumination, a SE measuring Mueller matrix elements (e.g. using rotating compensator(s)), a single-wavelength ellipsometer, a beam profile ellipsometer (angle-resolved ellipsometer), a beam profile reflectometer (angle-resolved reflectometer), a broadband reflective spectrometer (spectroscopic reflectometer), a single-wavelength reflectometer, an angle-resolved reflectometer, an imaging system, and a scatterometer (e.g. speckle analyzer).

The hardware configurations can be separated into discrete operational systems. On the other hand, one or more hardware configurations can be combined into a single tool. One example of such a combination of multiple hardware configurations into a single tool is described in U.S. Pat. No. 7,933,026, which is hereby incorporated by reference in its entirety for all purposes. In many cases, multiple metrology tools are used for measurements on single or multiple metrology targets. This is described, e.g. in by Zangooie et al., in U.S. Pat. No. 7,478,019, which is hereby incorporated by reference in its entirety for all purposes.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), a displacement between two or more structures (e.g., overlay displacement between overlaying grating structures, etc.), and a dispersion property value of a material used in the structure or part of the structure. Structures may include three dimensional structures, patterned structures, overlay structures, etc.

As described herein, the term "critical dimension application" or "critical dimension measurement application" includes any critical dimension measurement.

As described herein, the term "metrology system" includes any measurement system employed at least in part to characterize a specimen in any aspect, including systems that may be referred to as "inspection" systems. Such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor processing system (e.g., a metrology system or a lithography system) that may be used for processing a specimen. The term "specimen" is used herein to refer to a site, or sites, on a wafer, a reticle, or any other sample that may be processed (e.g., printed or inspected for defects) by means known in the art. In some examples, the specimen includes a single site having one or more measurement targets whose simultaneous, combined measurement is treated as a single specimen measurement or reference measurement. In some other examples, the specimen is an aggregation of sites where the measurement data associated with the aggregated measurement site is a statistical aggregation of data associated with each of the multiple sites. Moreover, each of these multiple sites may include one or more measurement targets associated with a specimen or reference measurement.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned". For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
one or more illumination sources configured to provide an amount of illumination light to one or more metrology targets disposed on a wafer in accordance with one or more different measurement system configurations;
one or more detectors configured to receive an amount of collected light from the one or more metrology targets in response to the amount of illumination light in accordance with the one or more measurement system configurations and generate measurement signals indicative of the collected light associated with each of the one or more measurement system configurations; and one or more computer systems configured to:
receive the measurement signals associated with each of the one or more measurement system configurations;
receive an amount of reference measurement data indicative of reference values of one or more parameters of interest of the one or more metrology targets disposed on the wafer, wherein the reference measurement data is received from a reference measurement source that is different from the metrology system;
estimate values of the one or more parameters of interest of the one or more metrology targets disposed on the wafer based on a fitting of a pre-computed measurement library function to the measurement signals based on a default set of library control parameter values; and
optimize one or more of the library control parameters to minimize differences between the reference data and the values of the one or more parameters of interest estimated based on the fitting of the pre-computed measurement library function to the measurement signals, wherein the optimizing is performed without recalculating the pre-computed measurement library function, wherein the one or more illumination sources are further configured to provide a second amount of illumination light to one or more metrology targets disposed on a second wafer in accordance with the one or more different measurement system configurations;

wherein the one or more detectors are further configured to receive an amount of collected light from the one or more metrology targets of the second wafer in response to the second amount of illumination light in accordance with the one or more measurement system configurations and generate a second plurality of measurement signals indicative of the collected light associated with each of the one or more measurement system configurations; and wherein the one or more computer systems are configured to:
receive the second plurality of measurement signals associated with each of the one or more measurement system configurations;
estimate values of the one or more parameters of interest of the one or more metrology targets disposed on the second wafer based on a fitting of the pre-computed measurement library function to the second plurality of measurement signals based on the optimized library control parameter values; and
communicate an indication of the values of the one or more parameters of interest to a semiconductor fabrication tool to adjust a fabrication process of the semiconductor fabrication tool.

2. The metrology system of claim 1, wherein the reference measurement source included any of a transmission electron microscope, a scanning electron microscope, an atomic force microscope, a scanning tunneling microscope, an x-ray based metrology system, or any combination thereof.

3. The metrology system of claim 1, wherein the pre-computed measurement library function is a trained neural network model.

4. The metrology system of claim 1, wherein the optimizing of the one or more library control parameters involves minimizing a cost function comprising a least squares error of one or more metrics characterizing a fit between the reference measurement data and corresponding values of the one or more parameters of interest estimated based on the fitting of the pre-computed measurement library function to the measurement signals.

5. The metrology system of claim 1, wherein the library control parameters include a plurality of measurement subsystem combination weights, a plurality of measurement signal weights, one or more specimen parameters fixed to specific values, and one or more constraints on floating parameter values.

6. The metrology system of claim 1, wherein the one or more measurement system configurations includes any of a spectroscopic ellipsometer configuration, a spectroscopic reflectometer configuration, a single-wavelength ellipsometer configuration, a single wavelength reflectometer configuration, a beam profile ellipsometer configuration, and a beam profile reflectometer configuration.

7. The metrology system of claim 1, wherein the parameters of interest include any of a shape parameter, stress, a material composition, lithography focus, lithography dosage, and overlay.

8. An Automated Measurement Library Control Parameter Optimization (AMLCPO) tool comprising computer-readable instructions stored on a non-transitory, computer-readable medium, the computer-readable instructions comprising:
code for causing a computing system to receive a plurality of measurement signals associated with measurements of one or more metrology targets disposed on a wafer in one or more measurement system configurations;
code for causing the computing system to receive an amount of reference measurement data indicative of reference values of one or more parameters of interest of the one or more metrology targets disposed on the wafer;
code for causing the computing system to estimate values of the one or more parameters of interest of the one or more metrology targets disposed on the wafer based on a fitting of a pre-computed measurement library function to the measurement signals based on a default set of library control parameter values; and
code for causing the computing system to optimize one or more of the library control parameters to minimize differences between the reference data and the values of the one or more parameters of interest estimated based on the fitting of the pre-computed measurement library function to the measurement signals, wherein the optimizing is performed without recalculating the pre-computed measurement library function;
code for causing the computing system to receive a second plurality of measurement signals associated with measurements of one or more metrology targets disposed on a second wafer in the one or more measurement system configurations;
code for causing the computing system to estimate values of the one or more parameters of interest of the one or more metrology targets disposed on the second wafer based on a fitting of the pre-computed measurement library function to the second plurality of measurement signals based on the optimized library control parameter values; and
code for causing the computing system to communicate an indication of the values of the one or more parameters of interest to a semiconductor fabrication tool to adjust a fabrication process of the semiconductor fabrication tool.

9. The AMLCPO tool of claim 8, wherein the reference measurement data is received from a reference measurement source that is different from the metrology system.

10. The AMLCPO tool of claim 8, wherein the optimizing of the one or more library control parameters involves minimizing a cost function comprising a least squares error of one or more metrics characterizing a fit between the reference measurement data and corresponding values of the one or more parameters of interest estimated based on the fitting of the pre-computed measurement library function to the measurement signals.

11. The AMLCPO tool of claim 8, wherein the library control parameters include a plurality of measurement subsystem combination weights, a plurality of measurement signal weights, one or more specimen parameters fixed to specific values, and one or more constraints on floating parameter values.

12. The AMLCPO tool of claim 8, wherein the one or more measurement system configurations includes any of a spectroscopic ellipsometer configuration, a spectroscopic reflectometer configuration, a single-wavelength ellipsometer configuration, a single wavelength reflectometer configuration, a beam profile ellipsometer configuration, and a beam profile reflectometer configuration.

13. The metrology system of claim 8, wherein the parameters of interest include any of a shape parameter, stress, a material composition, lithography focus, lithography dosage, and overlay.

14. A method comprising:
receiving a plurality of measurement signals associated with measurements of one or more metrology targets disposed on a wafer in one or more measurement system configurations;
receiving an amount of reference measurement data indicative of reference values of one or more parameters of interest of the one or more metrology targets disposed on the wafer;
estimating values of the one or more parameters of interest of the one or more metrology targets disposed on the wafer based on a fitting of a pre-computed measurement library function to the measurement signals based on a default set of library control parameter values; and
optimizing one or more of the library control parameters to minimize differences between the reference data and the values of the one or more parameters of interest estimated based on the fitting of the pre-computed measurement library function to the measurement signals, wherein the optimizing is performed without recalculating the pre-computed measurement library function;
receiving a second plurality of measurement signals associated with measurements of one or more metrology targets disposed on a second wafer in the one or more measurement system configurations;
estimating values of the one or more parameters of interest of the one or more metrology targets disposed on the second wafer based on a fitting of the pre-computed measurement library function to the second plurality of measurement signals based on the optimized library control parameter values; and
communicating an indication of the values of the one or more parameters of interest to a semiconductor fabrication tool to adjust a fabrication process of the semiconductor fabrication tool.

15. The method of claim 14, wherein the library control parameters include a plurality of measurement subsystem combination weights, a plurality of measurement signal weights, one or more specimen parameters fixed to specific values, and one or more constraints on floating parameter values.

16. The method of claim 14, wherein the one or more measurement system configurations includes any of a spectroscopic ellipsometer configuration, a spectroscopic reflectometer configuration, a single-wavelength ellipsometer configuration, a single wavelength reflectometer configuration, a beam profile ellipsometer configuration, and a beam profile reflectometer configuration.

\* \* \* \* \*